(12) United States Patent
Chen et al.

(10) Patent No.: US 7,443,753 B2
(45) Date of Patent: Oct. 28, 2008

(54) MEMORY STRUCTURE, PROGRAMMING METHOD AND READING METHOD THEREFOR, AND MEMORY CONTROL CIRCUIT THEREOF

(75) Inventors: Chung-Kuang Chen, Pan Chiao (TW); Ful-Long Ni, Hsinchu (TW); Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 16 days.

(21) Appl. No.: 11/602,308

(22) Filed: Nov. 21, 2006

(65) Prior Publication Data

US 2008/0117703 A1    May 22, 2008

(51) Int. Cl.
    *G11C 7/02* (2006.01)
(52) U.S. Cl. ...................... 365/210; 365/226
(58) Field of Classification Search ................ 365/210, 365/226
    See application file for complete search history.

(56) References Cited

U.S. PATENT DOCUMENTS

| 6,462,986 | B1 * | 10/2002 | Khan | 365/185.2 |
| 2002/0101778 | A1 * | 8/2002 | Khan | 365/230.03 |
| 2006/0274581 | A1 * | 12/2006 | Redaelli et al. | 365/185.22 |
| 2006/0279996 | A1 * | 12/2006 | Yu et al. | 365/185.21 |

* cited by examiner

*Primary Examiner*—Michael T Tran
(74) *Attorney, Agent, or Firm*—Rabin & Berdo, P.C.

(57) ABSTRACT

The memory structure improves a sensing accuracy of memory cells by dividing the main array into a number of memory units and sensing memory cells of each memory units with an appropriate set of reference currents. Each of the memory units corresponds to a reference group bit value, which indicates the appropriate set of reference currents. The appropriate set of reference currents is chosen from a number of sets of selective reference currents according to the threshold voltage distribution of each of the memory units. Thus each of the memory units of the memory structure of the present invention is sensed with its own appropriate set of reference currents correctly, and the improvement of sensing accuracy is therefore achieved.

24 Claims, 8 Drawing Sheets

| RGB | Vp1 | Vp2 | Vp3 | Ca | Cb | Cc |
|---|---|---|---|---|---|---|
| 000 | 4.7V | 4.7V | 4.7V | 7μA | 17μA | 27μA |
| 001 | 4.8V | 4.8V | 4.8V | 8μA | 18μA | 28μA |
| 010 | 4.9V | 4.9V | 4.9V | 9μA | 19μA | 29μA |
| 011 | 5.0V | 5.0V | 5.0V | 10μA | 20μA | 30μA |
| 100 | 5.1V | 5.1V | 5.1V | 11μA | 21μA | 31μA |
| 101 | 5.2V | 5.2V | 5.2V | 12μA | 22μA | 32μA |
| 110 | 5.3V | 5.3V | 5.3V | 13μA | 23μA | 33μA |
| 111 | 5.4V | 5.4V | 5.4V | 14μA | 24μA | 34μA |

FIG. 7A

| RGB | Vp1 | Vp2 | Vp3 | Ca | Cb | Cc |
|---|---|---|---|---|---|---|
| 000 | 4.7V | 4.8V | 4.9V | 7μA | 17μA | 27μA |
| 001 | 4.8V | 4.9V | 4.95V | 8μA | 18μA | 28μA |
| 010 | 4.9V | 5.0V | 5.05V | 9μA | 19μA | 29μA |
| 011 | 5.0V | 5.05V | 5.1V | 10μA | 20μA | 30μA |
| 100 | 5.1V | 5.2V | 5.3V | 11μA | 21μA | 31μA |
| 101 | 5.2V | 5.25V | 5.4V | 12μA | 22μA | 32μA |
| 110 | 5.3V | 5.4V | 5.5V | 13μA | 23μA | 33μA |
| 111 | 5.4V | 5.5V | 5.6V | 14μA | 24μA | 34μA |

FIG. 7B

MEMORY STRUCTURE, PROGRAMMING METHOD AND READING METHOD THEREFOR, AND MEMORY CONTROL CIRCUIT THEREOF

BACKGROUND OF THE INVENTION

1. Field of the Invention

The invention relates in general to a memory structure, and more particularly to a memory structure which uses reference group bit values to indicate sets of reference currents while sensing memory units.

2. Description of the Related Art

The memory capacity for storing data grows larger and larger recently. With the amount of the memory cells grows higher, the threshold voltage distribution range of the memory cells therefore becomes very large. FIG. 1A and FIG. 1B are examples of threshold voltage distribution diagrams of a conventional 1-Megabites memory and a conventional 1-Gigabites memory respectively. Both of them are 2-level cell memories. The horizontal axis represents the threshold voltage of a memory cell; the vertical axis represents the amount of memory cells. The threshold voltage distribution of the 1-Megabiyte memory includes distribution regions 101 to 104. SW1 is the sensing window between the high boundary of distribution region 101 and low boundary of distribution region 102. Similarly, SW2 is the sensing window between distribution regions 102 and 103. SW3 is the sensing window between distribution regions 103 and 104. Distribution regions 105 to 108 are threshold voltage distribution regions of the 1-Gigabiyte memory. Sensing windows SW4 to SW6 are the sensing windows of the 1-Gigabyte memory. As shown in FIG. 1A and FIG. 1B, the ranges of distribution regions 105 to 108 are generally larger than the ranges of distribution regions 101 to 104, which causes sensing windows SW4 to SW6 of the 1-Gigabyte memory are much narrower than the sensing windows SW1 to SW3 of the 1-Megabyte memory. Thus, when the capacity of a memory grows higher, the diversity of the threshold voltages of the memory cells of the memory becomes larger, and the sensing windows of the memory become narrower, which causes difficulty to perform the sensing process for distinguishing states of memory cells of the memory when reading the memory.

SUMMARY OF THE INVENTION

It is therefore an object of the invention to provide a memory structure. The sensing accuracy of memory cells is improved by dividing the main array of the memory structure into a number of memory units and sensing memory cells of each memory units with an appropriate set of reference currents. Each of the memory units corresponds to a reference group bit value, which indicates the appropriate set of reference currents. Thus each of the memory units of the memory structure is sensed with its own appropriate set of reference currents.

The invention achieves the above-identified object by providing a memory structure. The memory structure includes a main array and a reference group bit array. The main array includes a number of memory units. Each of the memory units includes a number of memory cells. Each of the memory units has a number of threshold voltage distribution regions. Each of the memory units corresponds to one of a couple of reference group bit values. The reference group bit array is for storing the reference group bit values of the memory units. Each of the reference group bit values corresponds to a set of reference currents. When sensing the memory units, the reference group bit values of the memory units are first obtained from the reference group bit array. The sets of reference currents corresponding to the memory units are generated. The memory cells of each of the memory units are then read according to the corresponding set of reference currents.

The invention achieves the above-identified object by providing a method for programming a memory. The memory including a number of memory units and a reference group bit array. Each of the memory units includes a couple of memory cells. The memory cells of the memory units have been programmed. The method includes: firstly, choose one of the memory units. Next, searching the boundary or peak of the distribution of the threshold voltages of the memory cells of the chosen memory unit. After that, select one reference group bit value from a couple of reference group bit values for the chosen memory unit according to the threshold voltage distribution regions, the selected reference group bit value is relative to a selected set of reference currents for reading the chosen memory unit. Then program the reference group bit value of the chosen memory unit into the reference group bit array. Next, check if the reference group bit values relative to the memory units are all programmed, if it is true, terminate the method, if it is false, choose another one of the memory units and repeating the method from the detecting step to the checking step.

The invention achieves the above-identified object by providing a method for reading a memory. The memory includes a number of memory units. Each of the memory units includes a number of memory cells. The method includes: Firstly, read a number of reference group bit values and saving the reference group bit values to a buffer memory. Each of the reference group bit values corresponds to one of the memory units. Next, choose one of the memory units. Afterward, read the reference group bit value corresponding to the chosen memory unit from the buffer memory. Next, generate a set of reference currents relative to the reference group bit value of the chosen memory unit. Then sensing the memory cells of the chosen memory unit by using the set of reference currents. Then, output data in the memory cells of the chosen memory unit. Finally, check if all of the memory units are sensed. If it is true, terminate the method. If it is false, choose another one of the memory units and repeat the method from the step of reading the reference group bit value to the checking step.

The invention achieves the above-identified object by providing a memory control circuit, used in a memory. The memory has a couple of memory units. Each memory unit has a couple of memory cells. The circuit includes a couple of reference current generators. Each of the reference current generators generates one reference current of a set of reference currents according to a reference group bit value. The set of reference currents is used for distinguishing a plurality of states of the memory cells when reading the corresponding memory unit. Each of the reference generators includes a power decoder, a voltage driver, and a reference cell. The power decoder receives the reference group bit value and outputs a reference power voltage according to the reference group bit value. The voltage driver receives the reference power voltage as power and outputs a reference voltage accordingly. The reference cell is controlled by the reference voltage and outputs one reference current of the set of reference currents accordingly.

The invention achieves the above-identified object by providing a memory control circuit, used in a memory. The memory has a couple of memory units. Each of the memory unit has a couple of memory cells. The circuit includes a couple of reference current generators. The set of reference current generators generates one reference current of a set of reference currents according to a reference group bit value. The set of reference currents is used for distinguishing a couple of states of the memory cells when reading the corresponding memory unit. Each of the reference current generators includes a reference group bit value decoder, a number of voltage drivers, and a number of reference cells. The reference group bit value decoder receives the reference group bit value. The voltage drivers are coupled to the reference group bit value decoder. Each of the reference cells is controlled by one of the voltage drivers. The reference group bit value decoder enables one of the voltage drivers according to the reference group bit value. The enabled voltage driver outputs a reference voltage to the corresponding reference cell. The corresponding reference cell then outputs the reference current accordingly.

Other objects, features, and advantages of the invention will become apparent from the following detailed description of the preferred but non-limiting embodiments. The following description is made with reference to the accompanying drawings.

BRIEF DESCRIPTION OF THE DRAWINGS

FIG. 7A illustrates an example of the relationships between the power voltages and the reference currents of the memory control circuit.

FIG. 7B illustrates another example of the relationships between the power voltages and the reference currents of the memory control circuit.

DETAILED DESCRIPTION OF THE INVENTION

Figure 1A:
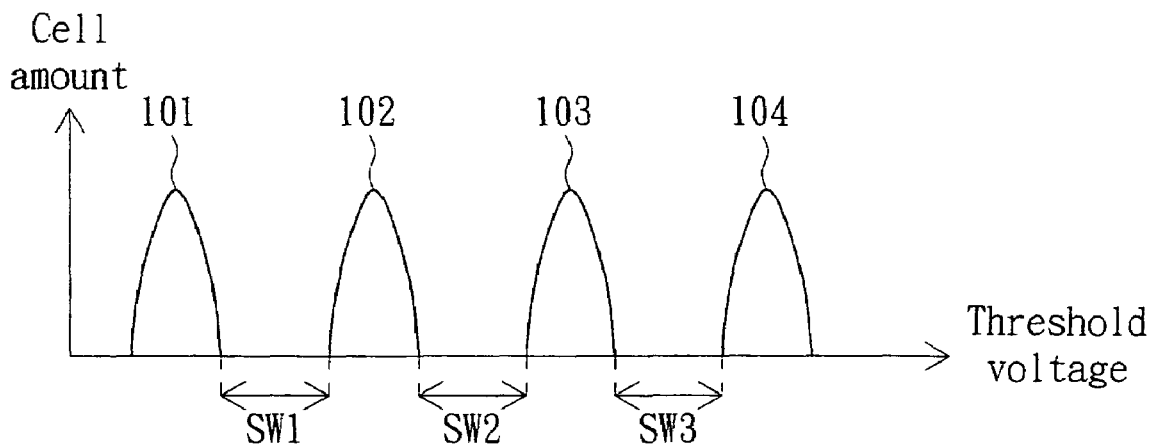
FIG. 1A is an example of threshold voltage distribution diagrams of a conventional 1-Megabites memory.
Figure 1B:
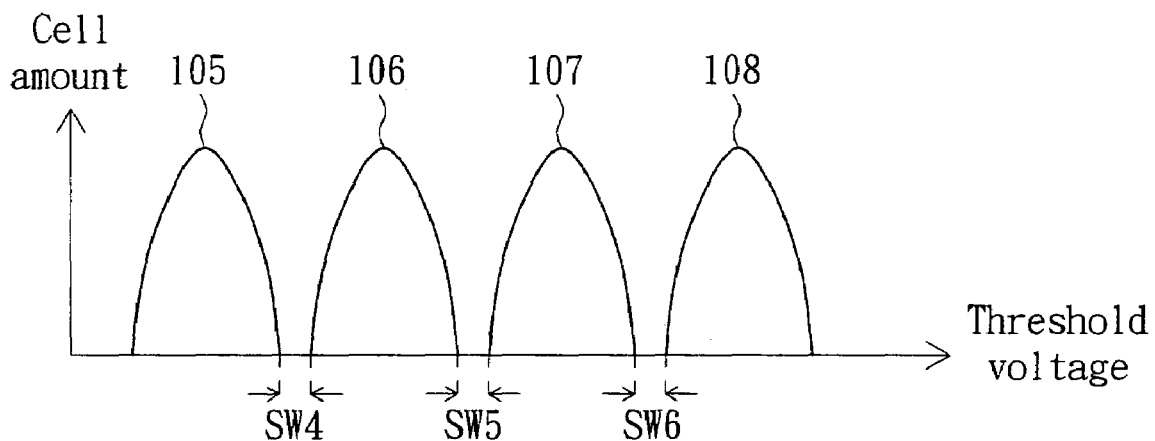
FIG. 1B is an example of threshold voltage distribution diagrams of a conventional 1-Gigabites memory.
Figure 2:
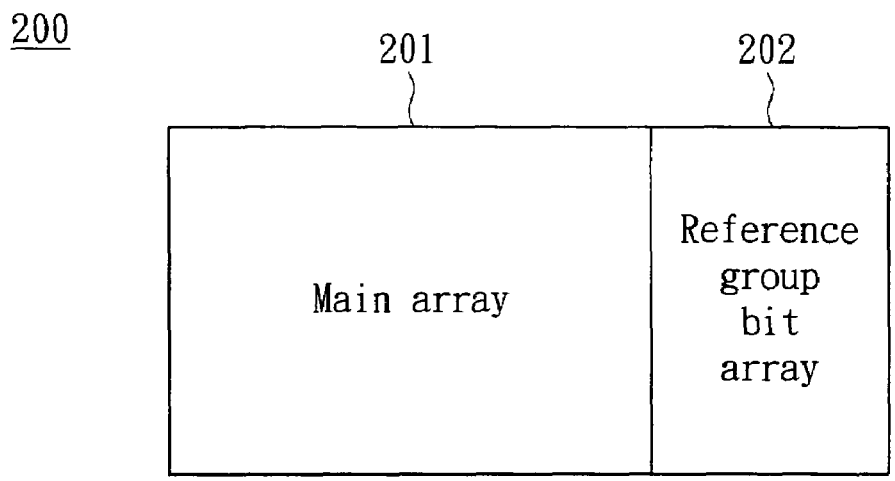
FIG. 2 is the memory structure according to an embodiment of the present invention.

A memory structure according to an embodiment of the present invention includes a main array and a reference group bit array. FIG. 2 is the memory structure according to an embodiment of the present invention. The memory structure 200 includes a main array 201 and a reference group bit array 202. The main array 201 includes a number of memory units. Each of the memory units includes a number of memory cells. Each of the memory units corresponds to a reference group bit value. The reference group bit value for each memory unit is relative to a set of reference currents. The set of reference currents is for distinguishing the states of memory cells in the corresponding memory unit when reading the memory. The reference group bit array 202 is for storing the reference group bit values.

By dividing the main array into the memory units, the set of reference currents for each memory unit is respectively set according to the threshold voltage distribution of memory cells in each memory unit, such that the set of reference currents for each memory unit is suited for performing the sensing process for distinguishing states of memory cells of each memory unit.

Figure 3A:
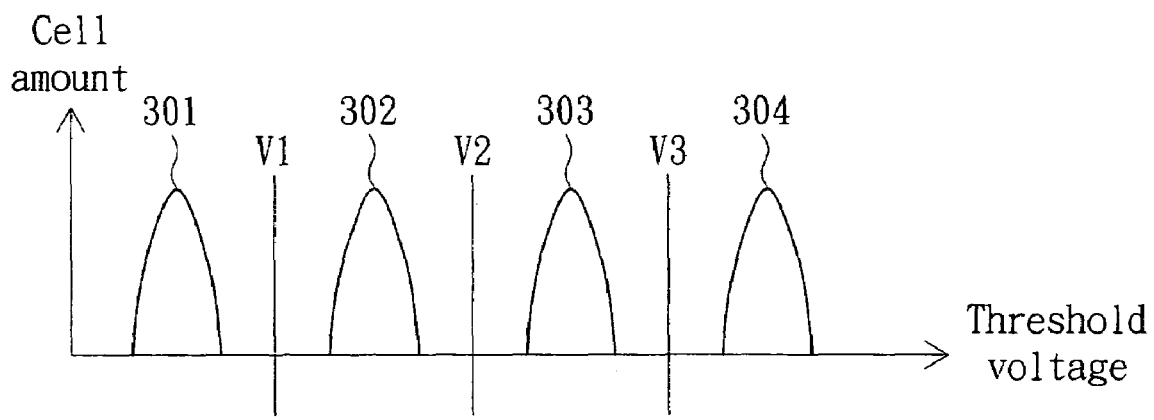
FIG. 3A illustrates an example of threshold voltage distribution diagram of a memory unit A of the memory units of the main array of the memory structure.
Figure 3B:
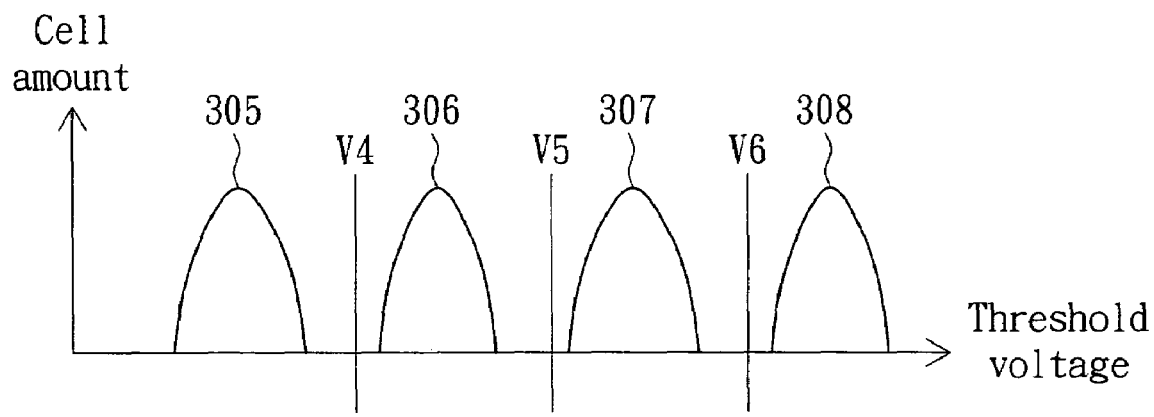
FIG. 3B illustrates an example of threshold voltage distribution diagram of a memory unit B of the memory units of the main array.

FIG. 3A illustrates an example of threshold voltage distribution diagram of a memory unit A of the memory units of the main array 201. FIG. 3B illustrates an example of threshold voltage distribution diagram of a memory unit B of the memory units of the main array 201. The threshold voltage distributions of the memory unit A and B respectively include a number of distribution regions.

The threshold voltage distribution of the memory unit A includes distribution regions 301 to 304. The distribution regions 301 to 304 are respectively corresponding to, for example, states 11,01,00,10 of memory cells of the memory unit A. The memory unit A corresponds to a reference group bit value, for example, 001, which corresponds to a set of reference currents C1 to C3. The set of reference currents C1 to C3 is relative to reference voltages V1 to V3 in FIG. 3A, which respectively fall in sensing windows between the distribution regions 301 to 304, when performing the sensing process. The states of the memory A can therefore be distinguished properly by the set of reference currents C1 to C3. Hence, the set of reference currents C1 to C3 relative to the reference group bit value 001, which is corresponding to the memory unit A, is suited for reading the memory unit A.

Similarly, the threshold voltage distribution of the memory unit B includes distribution regions 305 to 308. The distribution regions 305 to 308 are respectively corresponding to states 11, 01, 00, 10 of memory cells of the memory unit B. The memory unit B corresponds to a reference group bit value, for example, 011, which corresponds to a set of reference currents C4 to C6. The set of reference currents C4 to C6 are relative to reference voltages V4 to V6 in FIG. 3B, which respectively fall in sensing windows between the distribution regions 305 to 308. The set of reference currents C4 to C6 relative to the reference group bit value 011, which is corresponding to the memory unit B, is therefore suited for reading the memory unit B. As mentioned above, the set of reference currents corresponding one reference group bit value is suited for the memory unit corresponding the reference group bit value.

Figure 3C:
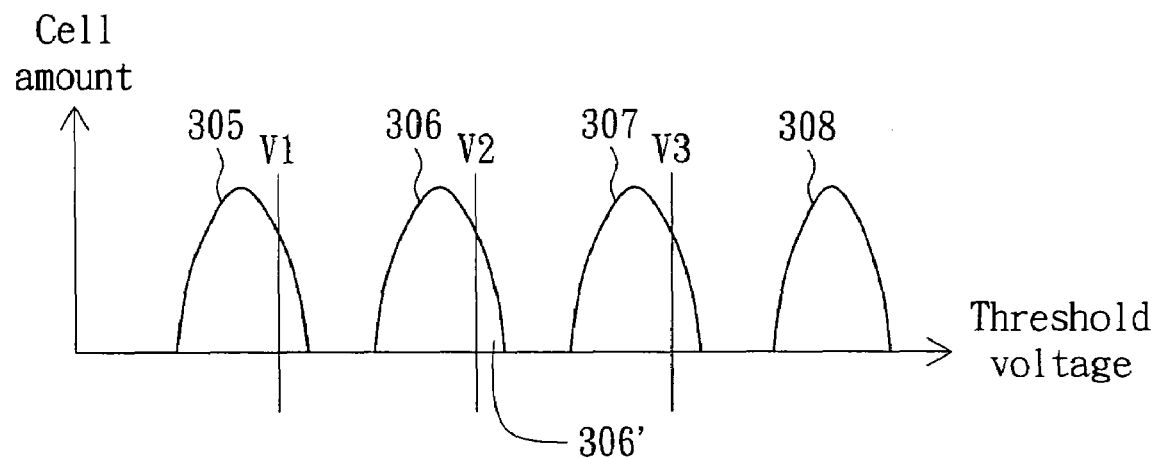
FIG. 3C illustrates a sensing error occurred when sensing the memory unit B with set A of reference currents.

The distributions of the memory units of the memory structure are usually not exactly the same. Therefore, a set of reference currents suited for each memory unit may not be the same. Each memory unit of the memory structure according to the embodiment of the present invention is provided with a reference group bit value, which indicates a set of reference currents suited for each memory unit. For example, the distributions of the memory unit A and B are not the same. If the reference currents C1 to C3, which are used in the memory unit A, are used to distinguish the memory unit B, as shown in FIG. 3C, then a sensing error may occur. For example, the memory cells whose threshold voltages fall to the distribution region 306' in FIG. 3C may be sensed as 00, instead of correct 01, due to the wrong reference voltage V2 corresponding to the wrong reference current C2.

The diversity of threshold voltages of the memory cells of the whole main array is larger than the diversity of threshold voltages of the memory cell of one of the memory units. Hence the sensing windows of the whole main array are narrower than the ones of one of the memory units. In the embodiment of the present invention, by dividing the main array into the memory units, the distribution regions of the threshold voltage distribution of each memory unit become more concentrated and therefore larger sensing windows between the distribution regions of each memory unit are obtained. For each memory unit it is easier to set reference currents to distinguish states of the memory cells of each memory unit. Each memory unit in the memory structure according to the embodiment has its own reference group bit value, which indicates the appropriate set of reference currents for each memory unit. All of the memory units in the memory structure according to the embodiment of the present invention can therefore be sensed correctly.

In the memory structure according to the embodiment, the reference group bit value of each memory unit is one of 8 reference group bit values 000, 001, 010, 011, 100, 101, 110, 111. Each of the reference group bit values 000 to 111 is relative to a set of reference currents. For example, the set of reference currents for sensing the memory unit A corresponds to the reference group bit value 001, while the reference group bit value of the memory unit A is 001.

However, the reference group bit value for each of the memory unit is not limited to be chosen from the eight 3-bit reference group bit values 000 to 111. The reference group bit value for each of the memory unit can be one of a number of predetermined reference group bit values. The reference group bit value for each of the memory units is decided such that the set of reference currents corresponding to the reference group bit value is appropriate for reading each of the memory unit. The amount of reference group bit value to be selected can be more or less. That is, the amount of sets of reference currents to be selected can be more or less.

The memory structure 200 according to the embodiment is a multi-level cell (MLC) memory structure. However, the memory structure of the present invention can also be a single-level cell (SLC) memory structure.

Figure 4:
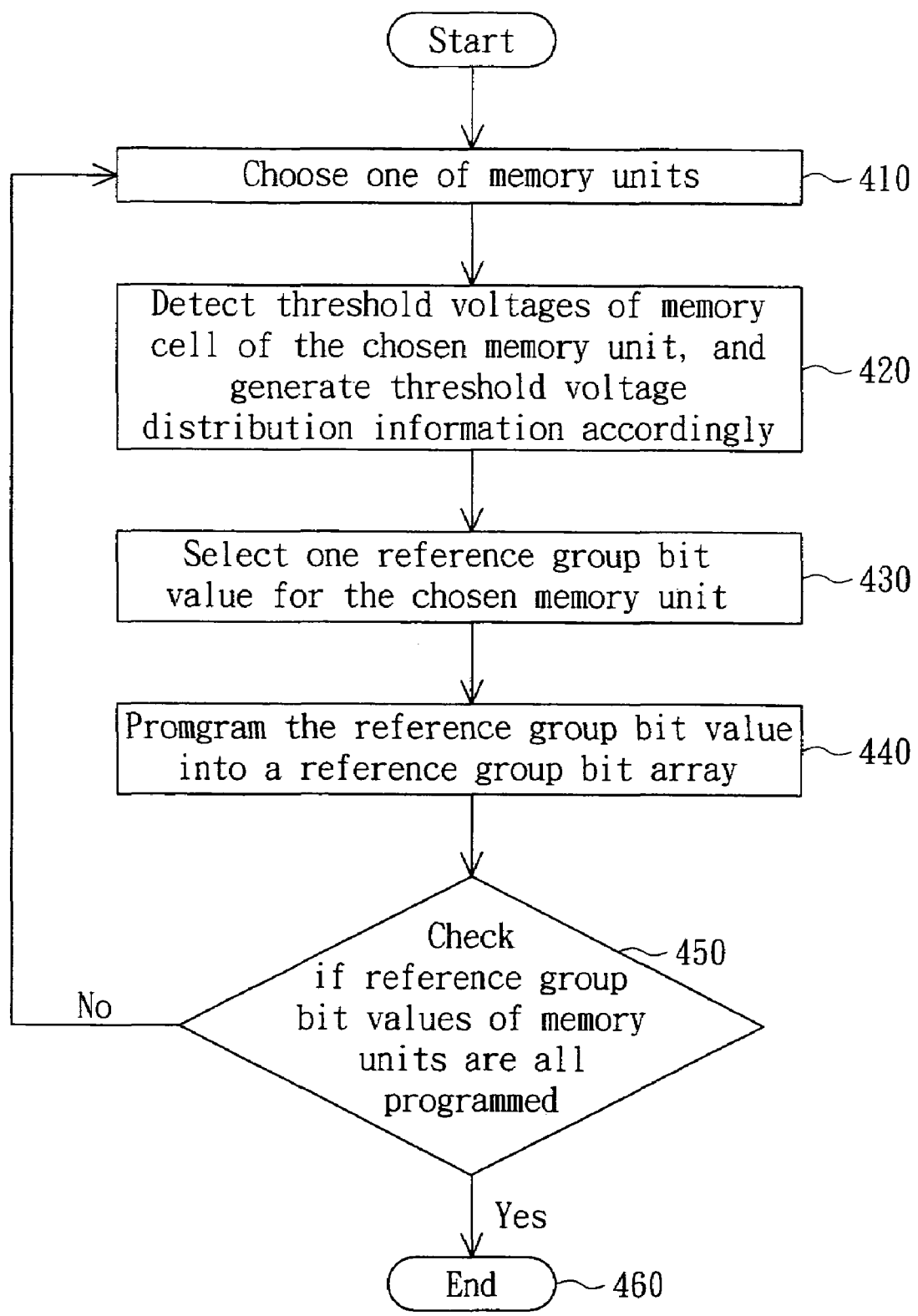
FIG. 4 is the flowchart of programming method for a memory.

FIG. 4 is the flowchart of programming method for the memory structure 200 according to the embodiment. In step 410 of FIG. 4, firstly choose one of the memory units, for example, the memory unit A of the memory structure 200. Take the memory unit A as an example to explain step 420 to 460. Next, in step 420, detect the threshold voltages of the memory cells of the chosen memory unit, that is, the memory unit A. And generate a threshold voltage distribution information of the memory unit A accordingly, that is, the distribution regions 301 to 304 in FIG. 3A. The low boundaries and high boundaries of the voltage distribution regions 301 to 304 of the memory unit A are then obtained.

In step 430, select one reference group bit value from a number of reference group bit values for the chosen memory unit according to the threshold voltage distribution information. The selected reference group bit value is relative to a selected set of reference currents for reading the chosen memory unit. A set of reference currents, which is the most suited for reading the chosen memory unit among the sets of reference currents, is selected by performing this step.

In this example, by checking which one of the sets of selective reference currents is the most appropriate one according to the low and high boundaries of the distribution regions 301 to 304, the reference group bit value 001 for the memory unit A is selected from the reference group bit value 000 to 111. That is, the most appropriate set of selective reference currents for the memory unit A corresponds to the reference group bit value 001, so the reference group bit value for memory A is chosen as 001.

Then, in step 440, save the reference group bit value of the chosen memory unit into the buffer memory Next, in step 450, check if the reference group bit values relative to the memory units are all programmed. If it is true, goes to step 460. If it is false, choose another one of the memory units in step 410 and repeat the method to step 450 until the reference group bit values for all of the memory units are saved into the buffer memory.

Then, program the reference group bit value of the chosen memory unit into the reference group bit array 202 of the memory structure 200 in step 460. In this example, the reference group bit value 001 of the memory unit A is programmed into the reference group bit array 202.

Figure 5:
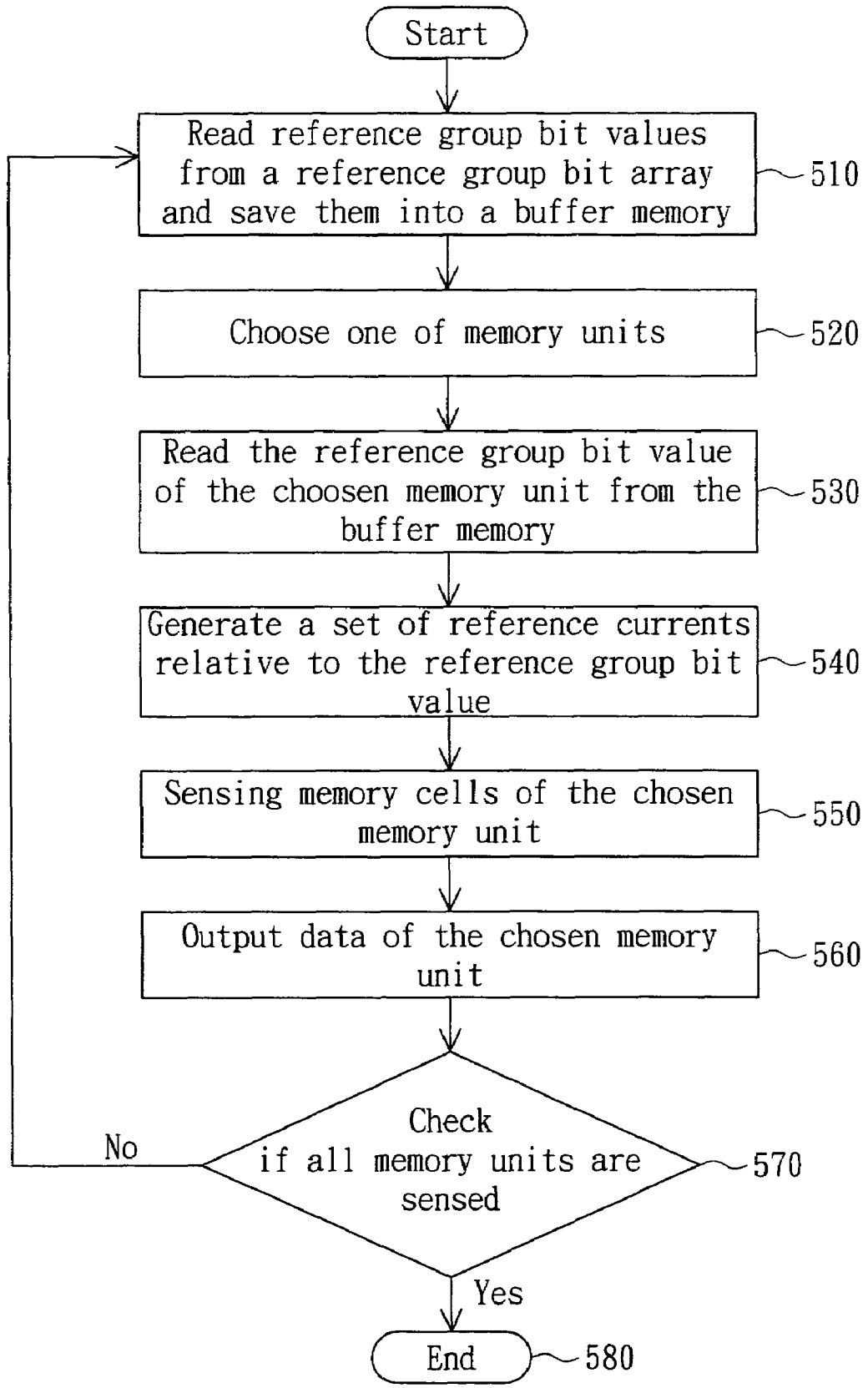
FIG. 5 is the flowchart of reading method for a memory.

FIG. 5 is the flowchart of the reading method of a read-only-memory. The memory has the memory structure 200 in FIG. 2. Firstly, in step 510, read all of the reference group bit values and save the reference group bit values to a buffer memory. The reference group bit value for each of the memory units corresponds to a set of reference currents, which is for reading the memory unit. Next, In step 520, choose one of the memory units, for example, the memory unit A of the memory structure 200. Then in step 530, read the reference group bit value, for example, 001, corresponding to the chosen memory unit, that is, the memory unit A, from the buffer memory.

Next, in step 540, generate a set of reference currents relative to the reference group bit value of the chosen memory unit. In this example, the set of reference currents C1 to C3 relative to the reference group bit value 001 is generated. Because the reference group bit value of the memory unit A is set as 001 in the programming process described before, the set of reference currents C1~C3 are generated as the set of selective reference currents corresponding to the selective bit value 001.

After that, sense the memory cells of the chosen memory unit, the memory unit A in this example, by using the set of reference currents in step 550. In this example, the memory cells of the memory unit A are sensed with the set of reference currents C1 to C3. The states of the memory cells of the memory unit A are distinguished with the set of reference currents C1 to C3. Next, in step 560, outputting data of the chosen memory unit, the memory unit A in this example. Afterward, check if all of the memory units are sensed In step 570. If it is true, in step 580, terminate the reading method. If it is false, the method is repeated from step 520 to sense other memory units in the main array of the memory structure 200 until all of the memory units are sensed.

Figure 6A:
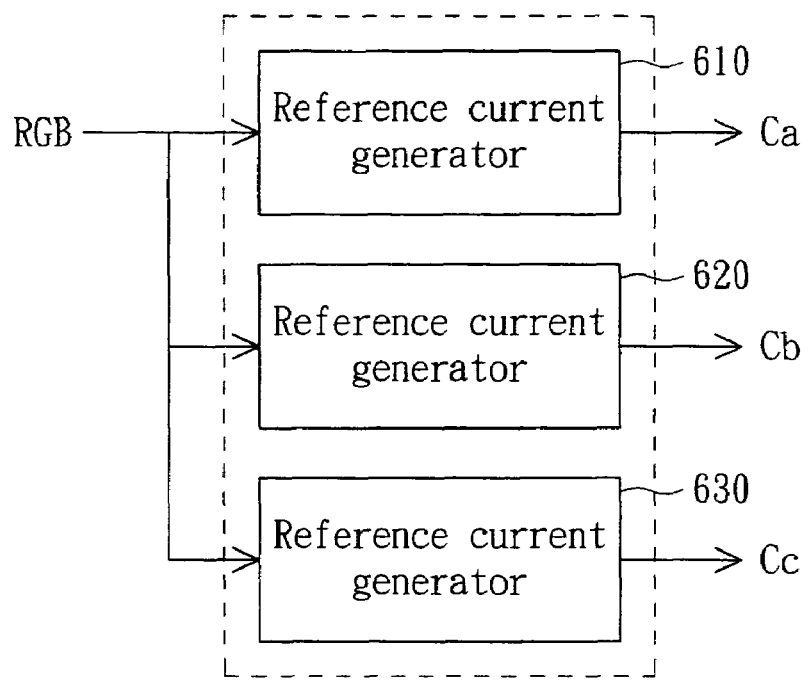
FIG. 6A is an example of a memory control circuit.

FIG. 6A is an example of a memory control circuit. The memory control circuit 600 in FIG. 6A is used for generating a set of reference currents Ca, Cb and Cc according to an inputted reference group bit value RGB, which is one of the reference group bit values 000 to 111 in the embodiment. In FIG. 6A, a memory control circuit 600 includes reference current generators 610 to 630. The reference current generators 610 to 630 generate reference currents Ca, Cb and Cc respectively according to the reference group bit value RGB. Take the memory unit A of the memory structure 200 in FIG. 2 as example to explain the operation of the memory circuit. The memory unit A corresponds to the reference group bit 001, which corresponds to the set of reference currents, e.g. 8

μA, 18 μA and 28 μA. When the reference current generators 610 receives the reference group bit value RGB as 001, the reference current Ca generated by the reference current generators 610 is then 8 μA. Similarly, the reference currents Cb and Cc generated by the reference current generators 620 and 630 are 18 μA and 28 μA respectively, when the reference current generators 620 and 630 receive the reference group bit value RGB as 001.

Figure 6B:
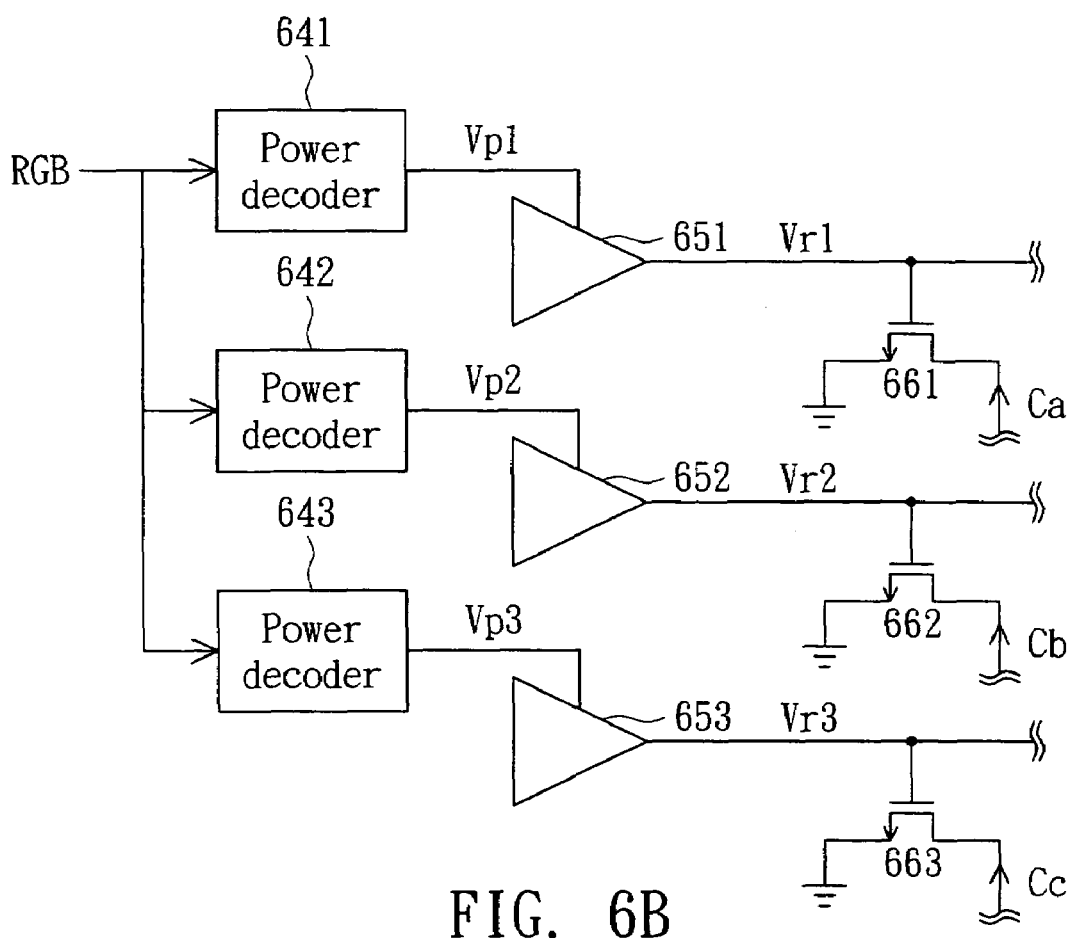
FIG. 6B is an example of the detail circuit diagram of the memory control circuit.

FIG. 6B is an example of the detail circuit diagram of the reference current generators 610 to 630 of the memory control circuit 600. The reference current generator 610 includes a power decoder 641, a voltage driver 651, and a reference cell 661. The power decoder 641 is for decoding the reference group bit value RGB and generating a power voltage Vp1 accordingly. The voltage driver 651 receives the power voltage Vp1 as power and generates a reference voltage Vr1 accordingly. The reference cell 661, e.g. a NMOS, is controlled by the voltage driver 651 and receives the reference voltage Vr1. In the reference current generator 611, the reference current Ca corresponding to the reference voltage Vr1 is generated at the source of the reference cell 661. In this example, the reference current Ca is generated as 8 μA, when the reference group bit value RGB is 001.

Similarly, the reference current generator 620 includes a power decoder 642, a voltage driver 652, and a reference cell 662. The power decoder 642 generates a power voltage Vp2 according to the reference group bit value RGB. The voltage driver 652 generates a reference voltage Vr2 according to the power voltage Vp2. The reference cell 662 receives the reference voltage Vr2 and generates the reference current Cb at the source.

Similarly, the reference current generator 630 includes a power decoder 643, a voltage driver 653, and a reference cell 663. The power decoder 643 generates a power voltage Vp3 according to the reference group bit value RGB. The voltage driver 653 generates a reference voltage Vr3 according to the power voltage Vp3. The reference cell 663 receives the reference voltage Vr3 and generates the reference current Cc accordingly.

The power voltages Vp1, Vp2 and Vp3 in the reference current generators 610 to 630 corresponding to the reference group bit value RGB can be designed to be the same or different. No matter the power voltages Vp1 to Vp3 are the same or different, the reference currents Ca, Cb and Cc corresponding to the inputted reference group bit value RGB are different.

FIG. 7A illustrates an example of the relationships between the power voltages Vp1 to Vp3 and the reference currents Ca to Cc corresponding to the reference group bit value RGB in FIG. 6B. Take the reference group bit value RGB as 001 as an example. When the reference group bit value RGB is 001, the set of reference currents Ca, Cb and Cc are respectively 8 μA, 18 μA and 28 μA. The power voltages Vp1 to Vp3 in the reference current generators 610 to 630 can be designed all as 4.8V. Therefore, the threshold voltages of the reference cells 661 to 663 in the reference current generators 610 to 630 are then respectively designed to satisfy the condition.

The power voltages Vp1 to Vp3 in the reference current generators 610 to 630 in FIG. 6B can also be designed to be different. FIG. 7B illustrates another example of the relationships between the power voltages Vp1 to Vp3 and the reference currents Ca to Cc corresponding to the reference group bit value RGB. Again, take the reference group bit value RGB as 001 as an example, the same set of reference currents Ca, Cb, Cc corresponds to the reference group bit value 001 is still 8 μA, 18 μA, 28 μA. The power voltages Vp1 to Vp3 can be designed as 4.8V, 4.9V, and 4.95V respectively. The threshold voltages of the reference cells 661 to 663 in the reference current generators 610 to 630 can be designed to achieve this goal. The threshold voltages of the reference cells 660 can be designed even to be the same to meet this constraint.

The power voltages Vp1 to Vp3 in the reference current generators 610 to 630 corresponding to an inputted reference group bit value can be designed to be the same or different. Whether the power voltages Vp1 to Vp3 are the same or not, the threshold voltages of the reference cells 661 to 663 in FIG. 6B are designed for generating a set of reference currents corresponding to the inputted reference group bit value.

Figure 6C:
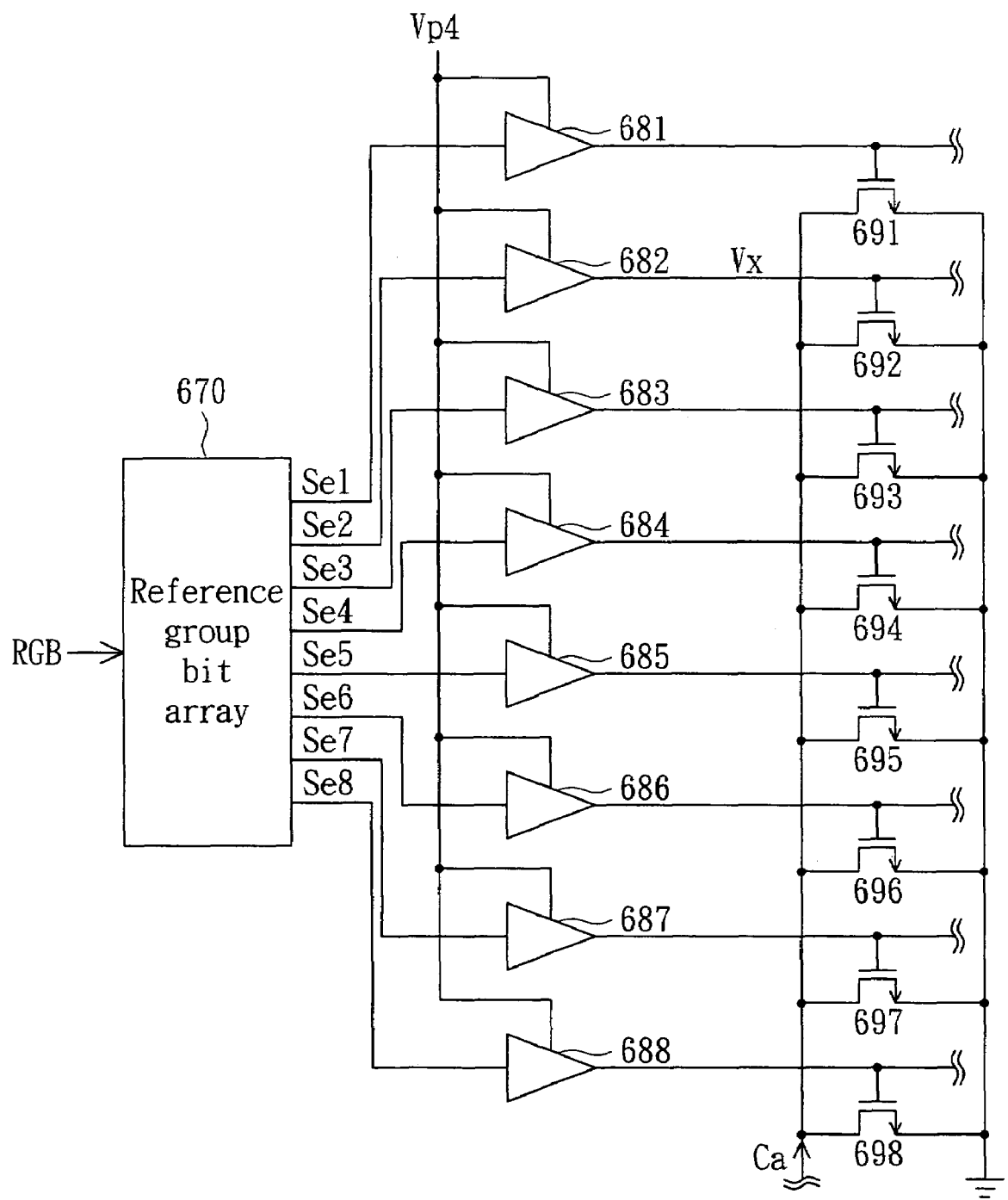
FIG. 6C is an example of the detail circuit diagram of one reference current generator of the memory control circuit.

FIG. 6C is another example of the detail circuit diagram of one of the reference current generators 610 to 630 of the memory control circuit 600. Each of the reference current generators 610 to 630 includes a reference group bit decoder 670, voltage dividers 681 to 688, reference cells 691 to 698 in this example.

The reference group bit decoder 670 receives the reference group bit value RGB in FIG. 6C, which is one of the reference group bit values 000 to 111, and generates one of enable signals Se1 to Se8 accordingly. The voltage driver 681 to 688 all receives a power voltage Vp4 as power. The enable signals Se1 to Se8 are respectively outputted when the inputted reference group bit value is 000 to 111.

The reference cells 691 to 698 are, for instance, NMOSs. The voltage drivers 681 to 688 are respectively enabled by the enable signals Se1 to Se8. The reference cells 691 to 698 are respectively controlled by the voltage drivers 681 to 688. An enabled voltage driver outputs a reference voltage to the gate of a corresponding reference cell and turns on the corresponding reference cell. The corresponding reference cell then outputs a reference current corresponding to the reference group bit value.

Take the reference current generator 610 as an example to explain the operation of the reference current generator in FIG. 6C. The reference current Ca is generated by the reference current generator 610 in FIG. 6C according to the reference group bit value RGB. When the reference group bit value RGB is 001, the enable signal Se2 corresponding to the reference group bit value 001 enables the voltage driver 682. The enabled voltage driver 682 then outputs a reference voltage Vx to the reference cell 692. The reference current Ca corresponding to the reference group bit value 001 is then generated at the drain of the reference cell 692.

Figure 8:
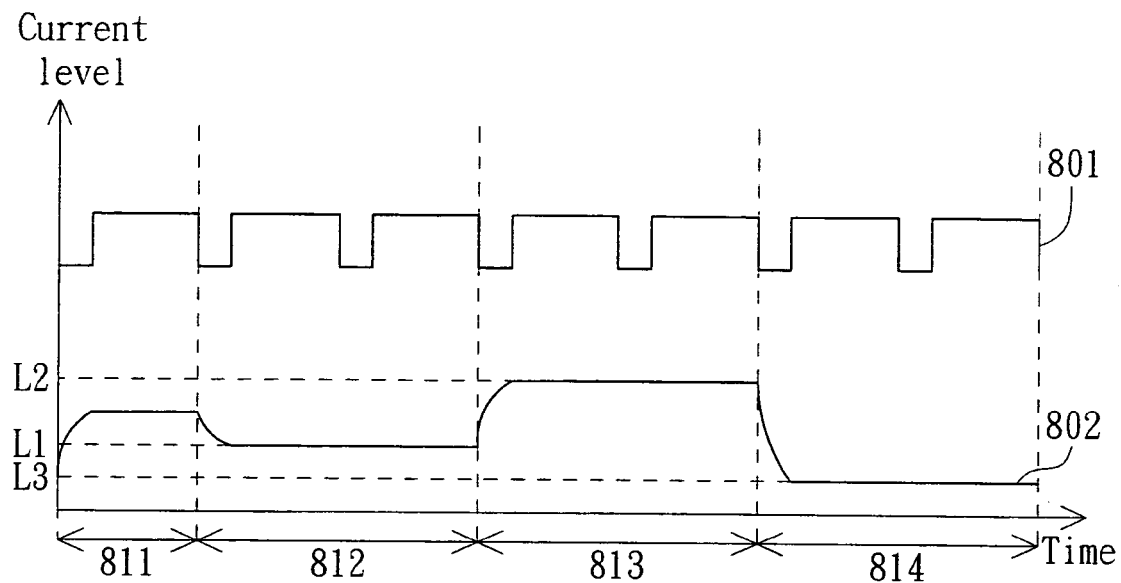
FIG. 8 is an example of the timing diagram of reference current in the memory control circuit.

The voltage drivers 681 to 688 of the reference current generator 610 all receive a voltage power Vp4 as power. The reference voltages outputted by the voltage drivers 681 to 688 are therefore the same. So the threshold voltages of the reference cell 691 to 698 must be different, for generating different reference currents when the reference group bit value RGB varies from 000 to 111. FIG. 8 is an example of the timing diagram of reference current in the memory control circuit 600 according to the embodiment of the present invention. The reference current generators 610, 620 and 630 can be the reference current generators in FIG. 6B or FIG. 6C. Here FIG. 6B is taken as example to explain the timing diagram. The horizontal axis and vertical axis of FIG. 8 are time and reference current value respectively. The waveform 801 stands for the sensing cycle. The waveform 802 represents the level of reference current.

The time interval 811 is the first sensing cycle. In the time interval 811, a reference group bit value is sensed and saved into a buffer memory when the waveform 801 is high. A memory unit corresponding to the reference group bit value is then sensed with the reference group bit value. The first reference cell, e.g. the reference cell 661 in FIG. 6B, generates the reference current during the time interval 812. The waveform 802 during the time interval 812 represents the reference current generated by the first reference cell. The level of the waveform 802 in the time interval 812 is L1.

Similarly, the waveform 802 during the time interval 813 represents the reference current generated by updating the RGB value The level of the waveform 802 in the time interval 813 is L2. The waveform 802 during the time interval 814 represents the reference current generated by updating the RGB value The level of the waveform 802 in the time interval 814 is L3.

Figure 9A:
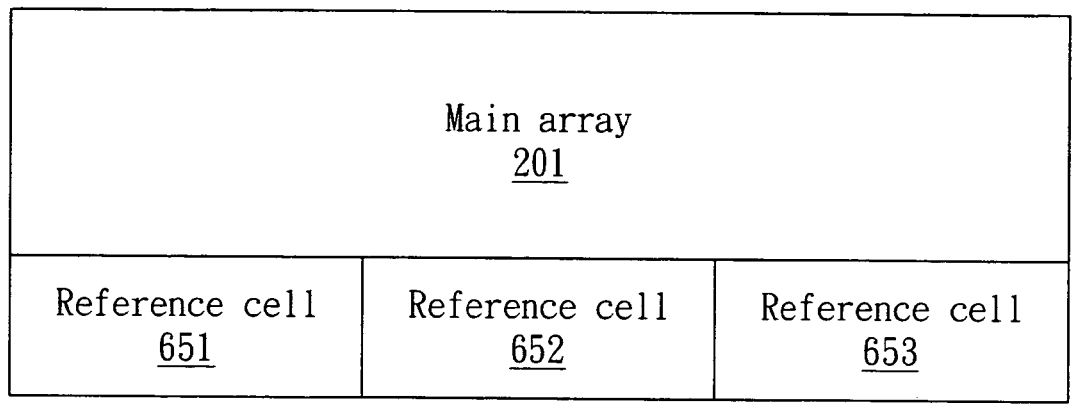
FIG. 9A illustrates the relationship between the main array of the memory structure and the reference cells of the memory control circuit.

The memory control circuit 600 in the embodiment has three reference current generators 610, 620 and 630. The reference current generators 610 to 630 have three reference cells 651, 652 and 653 for generating three reference currents for each memory unit of the main array 201 of the memory structure 200. FIG. 9A illustrates the relationship of the main array 201 and the reference cells 651, 652 and 653. However, the memory control circuit can be designed to have six or other amount of reference cells.

Figure 9B:
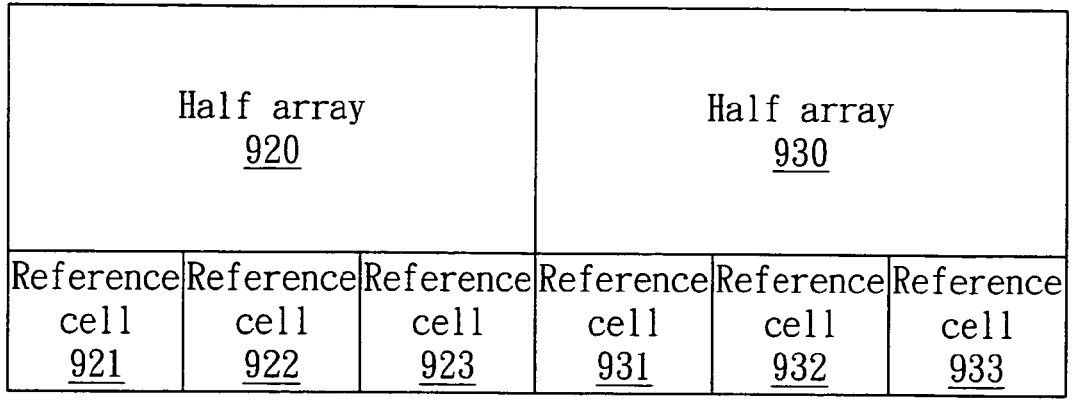
FIG. 9B illustrates another example of the relationship of the main array and reference cells of the memory control circuit.

FIG. 9B is another example of the relationship of the main array 201 and reference cells. The main array 201 is divided into two half arrays 920 and 930. Each half array has three reference cells for generating a set of reference currents. The reference cells 921, 922 and 923 are for generating a set of reference currents for each memory units of the half array 920. When reading one memory unit of the half array 920, the reference cells 921 to 923 generate a set of reference currents according to a reference group bit value of the memory unit. The reference cells 921, 922 and 923 are for generating a set of reference currents for each memory units of the half array 920. Similarly, when reading one memory unit of the half array 930, the reference cells 931 to 933 generate a set of reference currents according to a reference group bit value of the memory unit. The main array 201 can be divided into more parts and therefore more reference cells are needed.

The memory cells of memory structure 200 according to the embodiment of the present invention can be single-level cell (SLC) memory. When the memory cells of memory structure 200 are single-level cells, the threshold voltage distribution of each memory unit in the memory structure has 2 distribution regions, which are relative to 2 states of memory cells of each memory unit respectively. So a set of reference currents including 1 reference currents is needed to distinguish the 2 states of memory cells of each memory unit. A memory control circuit hence needs 1 reference current generators. The memory cells of memory structure 200 can be N-level cells. N is an integer larger than 1. The set of the reference currents may include a different amount of reference currents. The memory control circuit therefore needs a different amount of reference currents.

The 8 reference group bit values 000 to 111 are used in the memory structure according to the embodiment of the present invention. Each of reference group bit values corresponds to a set of selective reference currents. However, it is not limited to use the eight reference group bit values.

The main array of the memory structure of the present invention is divided into a number of memory units. The diversity of the threshold voltages of the memory cells of each memory unit is reduced. The ranges of the threshold voltage distribution regions of each memory unit therefore become narrower. Larger sensing windows between the voltage distribution regions are obtained. The sensing error is hence reduced.

The most suited set of reference currents for each memory cell is recorded by storing the reference group bit value for each memory unit. Hence, each of the memory units can be sensed by the most appropriate set of reference currents, although the threshold voltage distributions of the memory units are different. Thus the improvement of sensing accuracy is therefore achieved.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

The invention claimed is:

1. A memory structure, comprising:
a main array, comprising a plurality of memory units, each of the memory units comprising a plurality of memory cells, each of the memory units having threshold voltage distribution information, the distribution information corresponding to one set of a plurality of reference group bit values; and
a reference group bit array, for storing the reference group bit values;
wherein each of the reference group bit values corresponds to a set of reference currents;
wherein when sensing the memory units, the reference group bit values of the memory units are first obtained from the reference group bit array, the sets of reference currents corresponding to the memory units are generated, the memory cells of each of the memory units are then read according to the corresponding set of reference currents.

2. The memory structure according to claim 1, wherein the sets of reference currents relative to the reference group bits corresponds to the threshold voltage distribution information of the memory units.

3. The memory structure according to claim 1, wherein the distribution information can be the distribution high boundary, the distribution low boundary, the distribution peak value or the distribution N bits count value.

4. The memory structure according to claim 1, wherein the regions between any adjacent two threshold voltage distribution regions of each of the memory units are defined as a plurality of sensing windows, one reference voltage is selected from each of the sensing windows, each set of reference currents are corresponding to the reference voltages in the sensing windows of corresponding memory unit respectively.

5. The memory structure according to claim 1, wherein the memory structure is applied in multi-level cell (MLC) memory.

6. The memory structure according to claim 1, wherein the memory structure is applied in single-level cell (SLC) memory.

7. The memory structure according to claim 1, wherein the reference group bit array is applied in multi-level cell (MLC) memory.

8. The memory structure according to claim 1, wherein the reference group bit array is applied in single-level cell (SLC) memory.

9. A method for programming a memory, the memory comprising a plurality of memory units and a reference group bit array, each of the memory units comprising a plurality of memory cells, the memory cells of the memory units been programmed, the method comprising:
(a) choosing one of the memory units;

(b) detecting the threshold voltages of the memory cells of the chosen memory unit and generating a plurality of threshold voltage distribution information of the chosen memory unit accordingly;
(c) selecting one reference group bit values from a plurality of reference group bit values for the chosen memory unit according to the threshold voltage distribution information, wherein the selected reference group bit value is relative to a selected set of reference currents for reading the chosen memory unit;
(d) saving the reference group bit values to a buffer memory;
(e) checking if the reference group bit values relative to the memory units are all programmed, if it is true, terminating the method, if it is false, choosing another one of the memory units and repeating the method from step (b) to (d); and
(f) programming the reference group bit value of the chosen memory unit into the reference group bit array.

10. The method according to claim 9, wherein the threshold voltage distribution information is the distribution low boundary threshold voltage value, the distribution high boundary threshold voltage value, the distribution peak threshold voltage value or the distribution N bits count threshold voltage value.

11. The method according to claim 9, wherein the memory is a multi-level cell memory.

12. A method for reading a memory, the memory comprising a plurality of memory units, each of the memory units comprising a plurality of memory cells, the method comprising:
(a) reading a plurality of reference group bit values and saving the reference group bit values to a buffer memory, each of the reference group bit values corresponding to one of the memory units;
(b) choosing one of the memory units;
(c) reading the reference group bit values corresponding to the chosen memory unit from the buffer memory;
(d) generating a set of reference currents relative to the reference group bit value of the chosen memory unit;
(e) sensing the memory cells of the chosen memory unit by using the set of reference currents;
(f) outputting data of the chosen memory unit;
(g) checking if all of the memory units are sensed, if it is true, terminating the method, if it is false, choosing another one of the memory units and repeating the method from step (c) to (g).

13. The method according to claim 12, wherein the sets of reference currents corresponding to the reference group bit values are corresponding to the threshold voltage distribution information of the memory units.

14. The method according to claim 12, wherein the memory is a multi-level cell (MLC) memory.

15. The method according to claim 12, wherein the memory is single-level cell (SLC) memory.

16. A memory control circuit, used in a memory, the memory having a plurality of memory units, each memory unit having a plurality of memory cells, the circuit comprising:
a plurality of reference current generators, each of the reference current generators generating one reference current of a set of reference currents according to a reference group bit value, the set of reference currents used for distinguishing a plurality of states of the memory cells when reading the corresponding memory unit;
a power decoder, receiving the reference group bit value, and outputting a reference power voltage according to the reference group bit value;
a voltage driver, receiving the reference power voltage as power, and outputting a reference voltage accordingly; and
a reference cell, controlled by the reference voltage and outputting one reference current of the set of reference currents accordingly.

17. The circuit according to claim 16, wherein the power decoder chooses one of a plurality of selective power voltages as the reference power voltage according to the reference group bit values.

18. The circuit according to claim 16, wherein the reference cell is a NMOS, the gate of the reference cell receives the reference voltage, a first end of the reference cell is connected to a voltage source, and the reference current is generated at a second end of the reference cell.

19. The circuit according to claim 16, wherein the memory is a multi-level cell memory.

20. The circuit according to claim 16, wherein the memory is a single-level cell memory.

21. A memory control circuit, used in a memory, the memory having a plurality of memory units, each of the memory unit having a plurality of memory cells, the circuit comprising:
a plurality of reference current generators, each of the reference current generators generating one reference current of a set of reference currents according to a reference group bit value, the set of reference currents used for distinguishing a plurality of states of the memory cells when reading the corresponding memory unit, each of the reference current generators comprising:
a reference group bit values decoder, receiving the reference group bit values;
a plurality of voltage drivers, coupled to the reference group bit values decoder; and
a plurality of reference cells, each of the reference cells being controlled by one of the voltage drivers;
wherein the reference group bit values decoder enables one of the voltage drivers according to the reference group bit values, and the enabled voltage driver outputs a reference voltage to the corresponding reference cell, the corresponding reference cell then outputting the reference current accordingly.

22. The circuit according to claim 21, wherein the reference cells are NMOSs, the gate of each of the reference cells is connected to one of the voltage drivers, the first ends of the reference cells are connected to a voltage source, the enabled voltage driver outputs the reference voltage to turn on the corresponding reference cell, and the reference current is generated at the second end of the corresponding reference cell.

23. The circuit according to claim 21, wherein the memory is a multi-level cell memory.

24. The circuit according to claim 21, wherein the memory is a single-level cell memory.

* * * * *